(12) United States Patent
Yuan et al.

(10) Patent No.: US 9,806,097 B2
(45) Date of Patent: Oct. 31, 2017

(54) METAL OXIDE SEMICONDUCTOR THIN FILM, THIN FILM TRANSISTOR, AND THEIR FABRICATING METHODS, AND DISPLAY APPARATUS

(71) Applicants: BOE TECHNOLOGY GROUP CO., LTD, Beijing (CN); SOUTH CHINA UNIVERSITY OF TECHNOLOGY, Guangzhou (CN)

(72) Inventors: Guangcai Yuan, Beijing (CN); Liangchen Yan, Beijing (CN); Xiaoguang Xu, Beijing (CN); Lei Wang, Beijing (CN); Junbiao Peng, Beijing (CN); Linfeng Lan, Beijing (CN)

(73) Assignees: BOE TECHNOLOGY GROUP CO., LTD., Beijing (CN); SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 15/038,127

(22) PCT Filed: Dec. 10, 2015

(86) PCT No.: PCT/CN2015/096946
§ 371 (c)(1),
(2) Date: May 20, 2016

(87) PCT Pub. No.: WO2017/000503
PCT Pub. Date: Jan. 5, 2017

(65) Prior Publication Data
US 2017/0170208 A1 Jun. 15, 2017

(30) Foreign Application Priority Data
Jul. 1, 2015 (CN) .......................... 2015 1 0379122

(51) Int. Cl.
*H01L 29/10* (2006.01)
*H01L 29/12* (2006.01)
(Continued)

(52) U.S. Cl.
CPC ........ *H01L 27/1222* (2013.01); *H01L 29/045* (2013.01); *H01L 29/7869* (2013.01)

(58) Field of Classification Search
CPC H01L 27/1222; H01L 29/7869; H01L 29/045
See application file for complete search history.

(56) References Cited

U.S. PATENT DOCUMENTS

2006/0157104 A1   7/2006  Jung
2008/0048225 A1*  2/2008  Ahn ...................... C23C 16/409
                                                      257/295

(Continued)

FOREIGN PATENT DOCUMENTS

CN        103107130 A     5/2013
CN        104218096 A  * 12/2014         29/76
(Continued)

OTHER PUBLICATIONS

The World Intellectual Property Organization (WIPO) International Search Report and Written Opinion for PCT/CN2015/096946 dated Mar. 7, 2016 p. 1-12.

*Primary Examiner* — Victor A Mandala
(74) *Attorney, Agent, or Firm* — Anova Law Group, PLLC (57) ABSTRACT

A metal oxide semiconductor thin film, a thin film transistor (TFT), methods for fabricating the metal oxide semiconductor thin film and the TFT, and a display apparatus are provided. In some embodiments, the metal oxide semiconductor comprises: a first metal element, a second metal element and a third metal element, wherein: the first metal element is at least one of scandium, yttrium, aluminum, (Continued)

indium, and a rare earth element; the second metal element is at least one of calcium, strontium, and barium; and the third metal element is at least one of titanium and tin.

20 Claims, 3 Drawing Sheets

(51) Int. Cl.
    *H01L 27/12*     (2006.01)
    *H01L 29/04*     (2006.01)
    *H01L 29/786*     (2006.01)

(56) References Cited

U.S. PATENT DOCUMENTS

| | | | | |
|---|---|---|---|---|
| 2010/0147685 A1* | 6/2010 | Ikawa | ................. | G01N 27/128 204/431 |
| 2011/0266536 A1* | 11/2011 | Bae | ..................... | C23C 18/1216 257/43 |
| 2013/0105789 A1* | 5/2013 | Lan | ..................... | H01L 27/1225 257/43 |
| 2013/0200457 A1* | 8/2013 | Ogimoto | ............... | H01L 29/517 257/347 |
| 2013/0255761 A1* | 10/2013 | Mathieson | ........... | H01G 9/2068 136/256 |
| 2015/0047417 A1* | 2/2015 | Park | .................. | H01L 21/02425 73/31.06 |
| 2015/0087110 A1* | 3/2015 | Facchetti | .......... | H01L 21/02381 438/104 |
| 2016/0322591 A1* | 11/2016 | Seok | .................... | H01L 51/4213 |
| 2017/0170208 A1 | 6/2017 | Yuan et al. | | |

FOREIGN PATENT DOCUMENTS

| | | |
|---|---|---|
| CN | 104218096 A | 12/2014 |
| CN | 105118854 A | 12/2015 |

\* cited by examiner

METAL OXIDE SEMICONDUCTOR THIN FILM, THIN FILM TRANSISTOR, AND THEIR FABRICATING METHODS, AND DISPLAY APPARATUS

CROSS-REFERENCES TO RELATED APPLICATIONS

This application is a national phase entry under 35 U.S.C. §371 of International Application No. PCT/CN2015/096946, filed on Dec. 10, 2015, which claims priority to Chinese Patent Application No. 201510379122.0, filed on Jul. 1, 2015. The above enumerated patent applications are incorporated by reference herein in their entirety.

TECHNICAL FIELD

The disclosed subject matter generally relates to the display technologies and, more particularly, relates to a metal oxide semiconductor thin film, a related thin film transistor, a fabricating method of the metal oxide semiconductor thin film and the thin film transistor, and a related display apparatus.

BACKGROUND

In recent years, thin-film-transistor (TFT) has been widely used in flat panel display field, especially in the organic light-emitting diode (OLED) display field. Typically, a TFT comprises gate electrodes, insulating layers, an active layer, a source, a drain, and other necessary components. The active layer is normally fabricated using silicon material, such as amorphous silicon and/or other silicon materials.

Due to the carrier mobility is not high enough in silicon material, the silicon material-based TFTs also have the disadvantage of low carrier mobility.

Accordingly, it is desirable to provide a metal oxide semiconductor thin film, a related new TFT, a related new display apparatus, as well as a related new fabricating method.

BRIEF SUMMARY

In accordance with some embodiments of the disclosed subject matter, a metal oxide semiconductor thin film, a TFT containing the same, methods for fabricating the metal oxide semiconductor thin film and the TFT, and a related display apparatus are provided.

An aspect of the present disclosure provides a metal oxide semiconductor thin film. In some embodiments, the metal oxide semiconductor comprises: a first metal element, a second metal element and a third metal element, wherein: the first metal element is at least one of scandium, yttrium, aluminum, indium, and a rare earth element; the second metal element is at least one of calcium, strontium, and barium; and the third metal element is at least one of titanium and tin.

In some embodiments, the metal oxide has a chemical formula $M_xA_{1-x}BO_\delta$, wherein $0.001 \leq x \leq 0.5$, $\delta > 0$, M is the first metal element, A is the second metal element, and B is the third metal element.

In some embodiments, the metal oxide has a chemical formula $In_xBa_{1-x}TiO_\delta$.

In some embodiments, the metal oxide has a chemical formula $La_xSr_{1-x}SnO_\delta$.

In some embodiments, the metal oxide semiconductor thin film further comprises a plurality of crystalline phases.

In some embodiments, the plurality of crystalline phases comprise a perovskite crystalline phase.

In some embodiments, the plurality of crystalline phases further comprise at least one of: a crystalline phase of an oxide of the first metal element, a crystalline phase of an oxide of the second metal element, and a crystalline phase of an oxide of the third metal element.

In some embodiments, the plurality of crystalline phases further comprise at least one of: a crystalline phase of a ternary metal oxide, and a crystalline phase of a quaternary metal oxide.

In some embodiments, the metal oxide semiconductor thin film further comprises a unit cell of the perovskite crystalline phase includes a cubic lattice system, wherein the first metal element is located on a first vertex of the unit cell, the second metal element is located on a body-centered position of the unit cell, an oxide element is located on a face-centered position; and the third metal element is located on a second vertex of the unit cell.

In some embodiments, the metal oxide semiconductor has an etching rate less than 10 nm/min at a preset mass concentration of hydrochloric acid, wherein the preset mass concentration is greater than or equal to 3%, and less than or equal to 10%.

In some embodiments, the metal oxide semiconductor has a crystal grain size between 2 nm and 300 nm.

In some embodiments, the metal oxide semiconductor is a thin film that has a thickness between 10 nm and 300 nm.

Another aspect of the present disclosure includes a method for fabricating a metal oxide semiconductor thin film. In some embodiments, the method comprising: preparing a metal oxide target, wherein the metal oxide comprises a first metal element, a second metal element and a third metal element, the first metal element is at least one of scandium, yttrium, aluminum, indium, and a rare earth element, the second metal element is at least one of calcium, strontium, and barium, the third metal element is at least one of titanium and tin; and forming the metal oxide semiconductor thin film by processing the metal oxide target.

In some embodiments, the method further comprises: obtaining a mixture of a first oxide powder comprising the first metal element, a carbonate powder comprising the second metal element, and a second oxide powder comprising the third metal element; and sintering the mixture at a first predetermined temperature to obtain the metal oxide.

In some embodiments, the method further comprises: milling the metal oxide into a third oxide powder; pressing the third oxide powder into a piece of material plate; and machining the piece of material plate to obtain the metal oxide target.

In some embodiments, a ratio of the first oxide powder, the carbonate powder, and the second oxide powder is $(x/2):(1-x):1$, wherein $0.001 \leq x \leq 0.5$.

In some embodiments, the method further comprises annealing the metal oxide semiconductor thin film at a second preset temperature, wherein the second preset temperature is between 200° C. and 300° C.

In some embodiments, processing the metal oxide target by a physical vapor deposition.

Another aspect of the present disclosure provides a TFT. In some embodiments, the TFT comprises an active layer made of the disclosed metal oxide semiconductor thin film.

In some embodiments, the active layer has a thickness between 10 nm and 200 nm.

Another aspect of the present disclosure provides an TFT array substrate. In some embodiments, the TFT array substrate comprises the disclosed TFT.

Another aspect of the present disclosure provides a display apparatus, incorporating an disclosed TFT array substrate.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

FIG. 2-1 shows an exemplary method for fabricating a metal oxide semiconductor thin film in accordance with some embodiments of the disclosed subject matter;

FIG. 2-2 shows another exemplary method for fabricating a metal oxide semiconductor thin film in accordance with some embodiments of the disclosed subject matter;

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides a metal oxide semiconductor thin film, a TFT containing the same, methods for fabricating the metal oxide semiconductor thin film and the TFT, and a related display apparatus.

In accordance with some embodiments of the disclosed subject matter, a metal oxide semiconductor thin film is provided. In some embodiments, the metal oxide semiconductor thin film can be used to fabricate an active layer of a TFT.

In some embodiments, the material of the metal oxide semiconductor thin film is metal oxide, the metal oxide comprising a first metal element, a second metal element and a third metal element.

In some embodiments, the first metal element is at least one of the following elements: scandium (Sc), yttrium (Y), aluminum (Al), indium (In), and any one of the rare earth elements (REE).

In some embodiments, the second metal element is at least one of the following elements: calcium (Ca), strontium (Sr), and barium (Ba).

In some embodiments, the third metal element is at least one of the following elements: titanium (Ti), and tin (Sn).

By choosing the three metal elements from the above disclosed lists, the metal oxide semiconductor thin film can have many features, such as high electron mobility, wide band gap, uniform device performance, high current switching ratio, good light stability, low subthreshold swing, high acid resistance, and/or other characteristics. In addition, metal elements from the above disclosed lists are all easy to form crystalline phases, so that it is a simple process to fabricate the metal oxide semiconductor thin film. In some embodiments, referring to the production cost of the metal oxide semiconductor thin film, the conventionally-used noble metal elements such as gallium (Ga) element are not included. Production cost is reduced.

In some embodiments, the chemical formula of the metal oxide is $M_xA_{1-x}BO_\delta$, wherein $0.001 \leq x \leq 0.5$, $\delta > 0$, M is the first metal element, A is the second metal element, and B is the third metal element.

In some embodiments, the metal oxide with the chemical formula $M_xA_{1-x}BO_\delta$ can be obtained from three preparatory substances: a first oxide comprising the first metal element, a carbonate comprising the second metal element, and a second oxide comprising the third metal element.

In some embodiments, there are preset ratios among the first oxide, the carbonate, and the second oxide. In some embodiments, the preset ratios can be mole percent ratios. For example, the mole percent ratio among the first oxide, the carbonate, and the second oxide can be $(x/2):(1-x):1$. In such example, it is easy to form multiple crystalline phases (e.g., perovskite crystalline phase, etc.) from the original materials.

In some embodiments, the chemical formula of the first oxide comprising the first metal element can be $M_2O_3$. In some embodiments, the chemical formula of the carbonate comprising the second metal element can be $ACO_3$. In some embodiments, the chemical formula of the second metal oxide comprising the third metal element can be can be $BO_2$.

In some embodiments, forming the metal oxide with the chemical formula $M_xA_{1-x}BO_\delta$ can comprise the following steps: preparing the powders of the first oxide, the carbonate, and the second oxide; mixing the three powders by preset ratios; and sintering the mixture at a preset high temperature.

In some embodiments, the preset high temperature can be between 900° C. and 1650° C.

In some embodiments, during the high temperature sintering process, carbon element in the $ACO_3$ carbonate can become a form of volatile gases such as carbon dioxide. So that the chemical formula of the metal oxide $M_xA_{1-x}BO_\delta$ does not contain carbon element C.

Since $M_xA_{1-x}BO_\delta$ is a metal oxide with high stability of the chemical structure, a metal oxide semiconductor thin film made by $M_xA_{1-x}BO_\delta$ also has a high stability.

In some embodiments, the metal oxide $M_xA_{1-x}BO_\delta$ can be lanthanum strontium tin oxide $La_xSr_{1-x}SnO_\delta$, indium barium titanium oxide $In_xBa_{1-x}TiO_\delta$, or any other suitable metal oxide.

In some embodiments, the metal oxide semiconductor thin film having a mixed phase comprising a plurality of crystalline phases and/or amorphous phases. In some embodiments, a plurality of crystalline phases can reduce the size of the crystal grains of the metal oxide semiconductor thin film, improve the uniformity of metal oxide semiconductor thin film, reducing the concentration of excess carriers, and supporting the structure of the metal oxide semiconductor thin films.

In some embodiments, the plurality of crystalline phases comprise perovskite crystalline phase. In some embodiments, the perovskite crystalline phase can support the structure of the metal oxide semiconductor thin film. Further, the perovskite crystalline phase is a phase of thin film type which is good to form a metal oxide thin film.

In some embodiments, the plurality of crystalline phases comprise at least one of the following: the crystalline phase of the oxide that comprises the first metal element, the crystalline phase of the oxide that comprises the second metal element, and the crystalline phase of the oxide that comprises the third metal element.

In some embodiments, the multiple crystalline phases other than perovskite crystalline phase can reduce the size of the crystal grains of the metal oxide semiconductor thin film, thereby improving the uniformity of metal oxide semiconductor thin film, and reducing the concentration of excess carriers.

In some embodiments, the plurality of crystalline phases comprise ternary and/or quaternary metal oxides. In some embodiments, the plurality of crystalline phases do not comprise miscellaneous phases of grain boundary.

Figure 1:
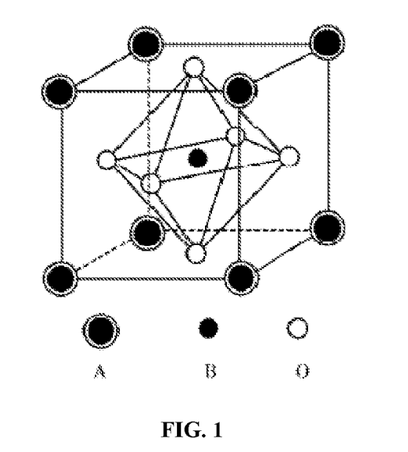
FIG. 1 is a schematic structural diagram of an exemplary perovskite crystalline cell in accordance with some embodiments of the disclosed subject matter.

Turning to FIG. 1, a schematic structural diagram of an exemplary unit cell of perovskite crystalline is shown in accordance with some embodiments of the disclosed subject matter.

In some embodiments, the unit cell of perovskite crystalline belongs to cubic lattice system. As illustrated, in the cubic structure of the perovskite crystalline unit cell, each of the first metal element A is located in a vertex of the unit cell, each of the second metal element B is located in a body-centered position of the unit cell, each of the oxygen elements O is located in a face-centered position. In some embodiments, although not shown in FIG. 1, one or more of the third metal elements M can take place of some first metal elements A and thereby are located at one or more substitution vertex positions.

In some embodiments, M is a trivalent metal ion, while A is a divalent metal ion. Therefore, when one or more of M are replaced by one or more of A, there would be surplus electrons existing, and n-type doping can be formed. Because of that, the doping amount of M can be used to regulate and/or control the carrier concentration and the carrier mobility of the metal oxide target.

In some embodiments, electron channels can be easily setup since it is easy to form overlaps of metal ion tracks in the perovskite crystalline structure. So that, the metal oxide semiconductor thin film with the perovskite crystalline structure can have a high electron mobility.

In some embodiments, the cubic structure of the perovskite crystalline unit cell can increase the stability of the material, which can simplify the process of fabricating the metal oxide semiconductor thin film.

In some embodiments, the metal oxide semiconductor thin film has an etching rate less than 10 nm/min at a preset mass concentration of hydrochloric acid. In some embodiments, the preset mass concentration can be greater than or equal to 3%, and less than or equal to 10% (e.g., can be about 4%, 5%, 6%, 7%, 8%, or 9%, etc.).

In some embodiments, the crystal grain size of the metal oxide semiconductor thin film is between 2 nm and 300 nm. In some embodiments, the uniformity of metal oxide semiconductor thin film is desirable when the crystal grain size is in the range of 2 nm to 300 nm.

In some embodiments, the thickness of the metal oxide semiconductor thin film is between 10 nm and 200 nm. In some embodiments, an active layer has a high stability when the active layer is fabricated from a metal oxide semiconductor thin film with a thickness between 10 nm and 200 nm.

Figure 21:
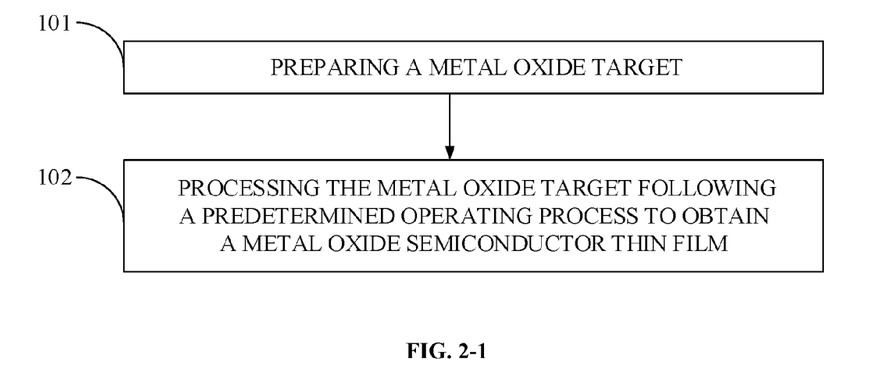

Turning to FIG. 2-1, an exemplary method for fabricating a metal oxide semiconductor thin film is shown in accordance with some embodiments of the disclosed subject matter.

As illustrated, the exemplary method can begin by preparing a metal oxide target at Step 101. In some embodiments, the metal oxide target can comprise a first metal element, a second metal element and a third metal element. In some embodiments, the first metal element is at least one of the following elements: scandium (Sc), yttrium (Y), aluminum (Al), indium (In), and any one of the rare earth elements (REE). In some embodiments, the second metal element is at least one of the following elements: calcium (Ca), strontium (Sr), and barium (Ba). In some embodiments, the third metal element is at least one of the following elements: titanium (Ti), and tin (Sn).

Next, at Step 102, the metal oxide target can be processed following a pre-determined operating process to obtain a metal oxide semiconductor thin film. In some embodiments, the obtained metal oxide semiconductor thin comprises one or more metal elements that described above, and thus can have many features, such as high electron mobility, wide band gap, uniform device performance, high current switching ratio, good light stability, low subthreshold swing, high acid resistance, and/or other characteristics. Further, one or more metal elements from the above disclosed lists are all easy to form crystalline phases, so that it is a simple process to fabricate the metal oxide semiconductor thin film. In some embodiments, referring to the production cost of the metal oxide semiconductor thin film, the conventionally-used noble metal elements such as gallium (Ga) element are not included. Production cost is reduced.

Figure 22:
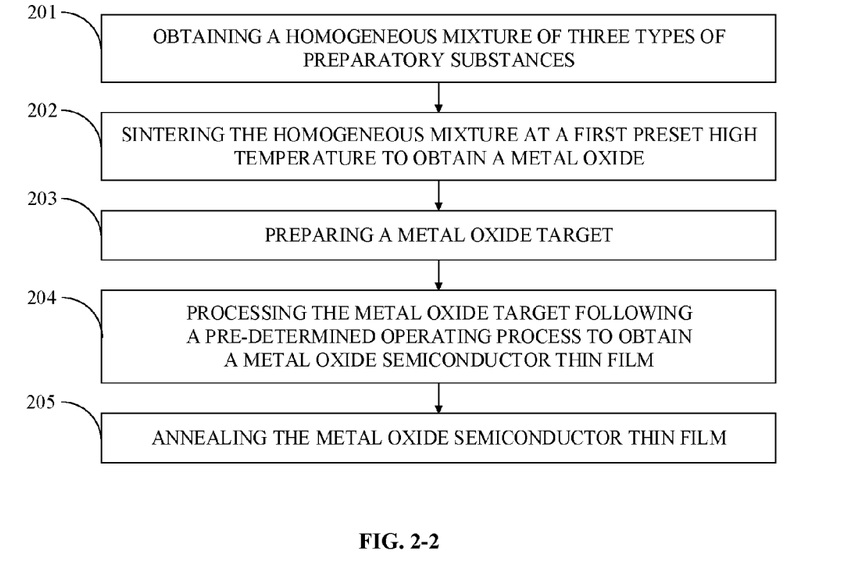

Turning to FIG. 2-2, another exemplary method for fabricating a metal oxide semiconductor thin film is shown in accordance with some embodiments of the disclosed subject matter.

As illustrated, the exemplary method can begin by obtaining a homogeneous mixture of three types of preparatory substances at Step 201. In some embodiments, the three types of preparatory substances can be: a first oxide powder comprising the first metal element, a carbonate powder comprising the second metal element, and a second oxide powder comprising the third metal element.

In some embodiments, the three types of preparatory substances are mixed in accordance with preset ratios. For example, the preset ratios can be mole percent ratios. In a particular example, the mole percent ratios among the first oxide, the carbonate, and the second oxide can be $(x/2):(1-x):1$, where $0.001 \leq x \leq 0.5$.

In some embodiments, the chemical formula of the first oxide comprising the first metal element can be $M_2O_3$, the chemical formula of the carbonate comprising the second metal element can be $ACO_3$, and the chemical formula of the second metal oxide comprising the third metal element can be can be $BO_2$, where M is the first metal element, A is the second metal element, and B is the third metal element.

For example, the first oxide, the carbonate, and the second oxide can be lanthanum oxide $La_2O_3$, strontium carbonate $SrCO_3$, and tin oxide $SnO_2$ respectively. Accordingly, a homogeneous mixture can be obtained from $La_2O_3$ powder, $SrCO_3$ powder, and $SnO_2$ powder at the preset mole percent ratios $(x/2):(1-x):1$.

As another example, the first oxide, the carbonate, and the second oxide can be indium oxide $In_2O_3$, barium carbonate $BaCO_3$, and titanium dioxide $TiO_2$ respectively. Accordingly, a homogeneous mixture can be obtained from $In_2O_3$ powder, $BaCO_3$ powder, and $TiO_2$ powder at the preset mole percent ratios $(x/2):(1-x):1$.

Next, at Step 202, the homogeneous mixture can be sintered at a first preset high temperature to obtain a metal oxide that comprises the first metal element, the second metal element and the third metal element.

In some embodiments, the first preset high temperature is between 900° C. and 1650° C. In some embodiments, during the high temperature sintering process, carbon element in the $ACO_3$ carbonate can become a form of volatile gases such as carbon dioxide. So that the chemical formula of the resultant metal oxide $M_xA_{1-x}BO_\delta$ does not contain carbon element C.

In some embodiments, the obtained metal oxide from the high temperature sintering process is a sintered block. For example, at a temperature between 900° C. and 1650° C., sintering the mixture of the $La_2O_3$ powder, $SrCO_3$ powder, and $SnO_2$ powder can get a $La_xSr_{1-x}SnO_\delta$ sintered block. As another example, at a temperature between 900° C. and 1650° C., sintering the mixture of the $In_2O_3$ powder, $BaCO_3$ powder, and $TiO_2$ powder can get a $In_xBa_{1-x}TiO_\delta$ sintered block.

In some embodiments, first preset high temperature is determined by the value of x. A higher value of x corresponds to a higher sintering temperature.

Next, at Step 203, the metal oxide can be used to prepare a metal oxide target. In some embodiments, the preparation process can comprise: milling one or more metal oxide sintered blocks into powder; pressing the milled powder into a piece of material plate; sintering the piece of material plate at the second preset high temperature; and machining the sintered piece of material plate into the metal oxide target.

In some embodiments, the second preset high temperature is between 1000° C. and 1800° C. In some embodiments, after the sintering process, the material plate can have an improved hardness, and thereby can be easily machined.

Next, at Step 204, the metal oxide target can be processed following a pre-determined operating process to obtain a metal oxide semiconductor thin film. In some embodiments, the metal oxide semiconductor thin film can be obtained by a physical vapor deposition operation on the metal oxide target at a preset depositing temperature.

At Step 205, an annealing operation is performed to the metal oxide semiconductor thin film. In some embodiments, the temperature of the annealing operation is between 200° C. and 300° C. In some embodiments, the metal oxide semiconductor thin film can have better properties after the annealing operation.

The following are two particular examples of the second method for fabricating a metal oxide semiconductor thin film as described in accordance with FIG. 2-2.

The first particular example is the process for fabricating $La_xSr_{1-x}SnO_\delta$ semiconductor thin film. Particularly, the process comprises: homogeneously mixing the $La_2O_3$ powder, the $SrCO_3$ powder, and the $SnO_2$ powder at a preset mole percent ratios $(x/2):(1-x):1$; sintering the mixture at a temperature between 900° C. and 1450° C.; milling the sintered product into fine powder; pressing the fine powder into a piece of material plate; sintering the piece of material plate at a temperature between 1000° C. and 1800° C. to generated a target; mounting the target on a sputtering apparatus; performing sputtering operation on the target, wherein a sputtering temperature is 500° C., and an annealing temperature is 300° C.; and obtaining a $La_xSr_{1-x}SnO_\delta$ semiconductor thin film, wherein the $La_xSr_{1-x}SnO_\delta$ semiconductor thin film has a thickness of 40 nm.

In the above described particular example, the obtained $La_xSr_{1-x}SnO_\delta$ semiconductor thin film comprises the perovskite crystalline phase and the $SnO_2$ crystalline phase. In some embodiments, in the cubic structure of the perovskite crystalline unit cells, Sr elements are located in vertexes of the unit cells, Sn elements are located in body-centered positions of the unit cells, La elements take places of some Sr elements and are located at substitution vertex positions. In some embodiments, the crystal grain size of the $La_xSr_{1-x}SnO_\delta$ semiconductor thin film is about 2 nm to 80 nm. In some embodiments, the band gap of the $La_xSr_{1-x}SnO_\delta$ semiconductor thin film is between 3.5 eV and 4.2 eV.

In some embodiments, in the hydrochloric acid at a preset mass concentration, the etching rate of the $La_xSr_{1-x}SnO_\delta$ semiconductor thin film depends on the value of x. For example, when the value of x is 0.001, 0.1, and 0.5 respectively, the etching rate of the $La_xSr_{1-x}SnO_\delta$ semiconductor thin film can be 2 nm/min, 3 nm/min, and 8 nm/min respectively, wherein the preset mass concentration of the hydrochloric acid is greater than or equal to 3%, and less than or equal to 10%. Accordingly, the field effect mobility of the thin film transistor that comprises the active layer fabricated by the $La_xSr_{1-x}SnO_\delta$ semiconductor thin films with different value of x can be 1.6 $cm^2/Vs$, 12.8 $cm^2/Vs$, and 0.3 $cm^2/Vs$, respectively.

The second particular example is the process for fabricating $In_xBa_{1-x}TiO_\delta$ semiconductor thin film. Particularly, the process comprises: homogeneously mixing the $In_2O_3$ powder, the $BaCO_3$ powder, and the $TiO_2$ powder at a preset mole percent ratios $(x/2):(1-x):1$; sintering the mixture at a temperature between 900° C. and 1450° C.; milling the sintered product into fine powder; pressing the fine powder into a piece of material plate; sintering the piece of material plate at a temperature between 1000° C. and 1800° C. to generated a target; mounting the target on a sputtering apparatus; performing sputtering operation on the target, wherein a sputtering temperature is 200° C., and an annealing temperature is 450° C.; and obtaining a $In_xBa_{1-x}TiO_\delta$ semiconductor thin film.

In the above described particular example, the obtained $In_xBa_{1-x}TiO_\delta$ semiconductor thin film comprises the perovskite crystalline phase, the BaO crystalline phase, and $TiO_\delta$ crystalline phase. In some embodiments, in the cubic structure of the perovskite crystalline unit cells, Ba elements are located in vertexes of the unit cells, Ti elements are located in body-centered positions of the unit cells, In elements take places of some Ba elements and are located at substitution vertex positions. In some embodiments, the crystal grain size of the $In_xBa_{1-x}TiO_\delta$ semiconductor thin film is about 40 nm to 200 nm. In some embodiments, the band gap of the $La_xSr_{1-x}SnO_\delta$ semiconductor thin film is between 3.6 eV and 4.2 eV.

In some embodiments, in the hydrochloric acid at a preset mass concentration, the etching rate of the $In_xBa_{1-x}TiO_\delta$ semiconductor thin film depends on the value of x. For example, when the value of x is 0.001, 0.1, and 0.5 respectively, the etching rate of the $In_xBa_{1-x}TiO_\delta$ semiconductor thin film can be 1 nm/min, 2 nm/min, and 10 nm/min respectively, wherein the preset mass concentration of the hydrochloric acid is greater than or equal to 3%, and less than or equal to 10%. Accordingly, the field effect mobility of the thin film transistor that comprises the active layer fabricated by the $In_xBa_{1-x}TiO_\delta$ semiconductor thin films with different value of x can be 0.6 $cm^2/Vs$, 18 $cm^2/Vs$, and 12 $cm^2/Vs$, respectively.

Comparing the first and the second particular examples, the thin film transistor that comprises the active layer fabricated by $In_xBa_{1-x}TiO_\delta$ has a field effect mobility of 18 cm$^2$/Vs, which is higher than the thin film transistor that comprises the active layer fabricated by $La_xSr_{1-x}SnO_\delta$.

In some embodiments, the metal oxide material used for forming the metal oxide semiconductor thin film comprises a first metal element, a second metal element and a third metal element, wherein the first metal element is at least one of Sc, Y, Al, In, and/or REE, the second metal element is at least one of Ca, Sr, and/or Ba, the third metal element is at least one of Ti, and/or Sn. Because of that, the oxide semiconductor thin film can have high electron mobility, wide band gap, uniform device performance, high current switching ratio, good light stability, low subthreshold swing, high acid resistance, and/or other characteristics.

Figure 3:
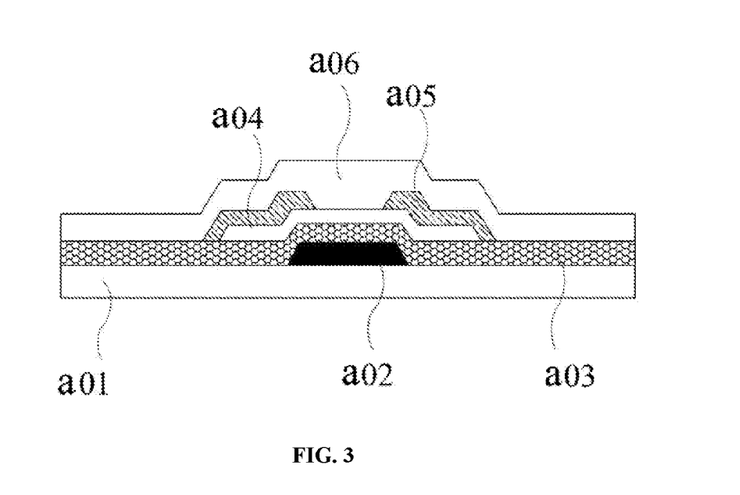
FIG. 3 is a schematic structural diagram of a TFT containing a metal oxide semiconductor thin film in accordance with some embodiments of the disclosed subject matter.

Turing to FIG. 3, a schematic structural diagram of a TFT containing a metal oxide semiconductor thin film is shown in accordance with some embodiments of the disclosed subject matter. In some embodiments, an active layer of the TFT is fabricated by the metal oxide semiconductor thin film. In some embodiments, the metal oxide semiconductor thin film can be any metal oxide semiconductor thin film described above. In some embodiments, the active layer of the TFT has a thickness between 10 nm and 200 nm.

As illustrated, the TFT can have a back channel etch structure, comprising substrate a01, gate electrode a02, insulating layer a03, active layer a04, source and drain electrodes a05, and passivated layer a06.

In some embodiments, gate electrode a02 is located above substrate a01. Insulating layer a03 is located above substrate a01 and gate electrode a02. Active layer a04 is located above the up-surface of insulating layer a03 and corresponds to gate electrode a02. Source and drain electrodes a05 are spaced separately from each other and connect with the two side-electrodes of active layer a04 respectively. Passivated layer a06 is located above the up-surfaces of active layer a04, and source and drain electrode a05.

Substrate a01 can be any suitable substrate, such as glass substrate, metal substrate, or polymer substrate. In some embodiments, substrate a01 has a buffer layer and an aqueous oxygen barrier layer. In some embodiments, a metal substrate a01 can be a metal foil. In some embodiments, a polymer substrate a01 can be polyethylene naphthalate (PEN), polyethylene terephthalate (PET), or polyimides (PI).

In some embodiments, gate electrode a02 can be any suitable metal conductive layer. For example, gate electrode a02 can be a metal layer of single element such as aluminum (Al), copper (Cu), molybdenum (Mo), titanium (Ti), silver (Ag), gold (Au), tantalum (Ta), tungsten (W), chromium (Cr), or any suitable metal elements. As another example, gate electrode a02 can be an alloy layer comprising two or more metal elements thereof. As another example, gate electrode a02 can be a multilayer film comprising two of more of metal layers of single elements, and/or alloy layers.

In some embodiments, gate electrode a02 can be Indium Tin Oxides (ITO), or any other suitable conductive films. In some embodiments, gate electrode a02 has a thickness between 100 nm and 2000 nm.

In some embodiments, insulating layer a03 is an insulating film. For example, insulating layer a03 can be a monolayer film of $SiO_2$, $Si_3N_4$, $Al_2O_3$, $Ta_2O_5$, $Y_2O_3$, or other suitable insulating material. As another example, insulating layer a03 can be a multilayer film comprising various insulating materials. In some embodiments, the thickness of insulating layer a03 is between 50 nm and 500 nm.

In some embodiments, active layer a04 is an inorganic metal oxide semiconductor thin film comprising the perovskite crystalline phase and at least one other type crystalline phase. In some embodiments, the chemical formula of the active layer is $M_xA_{1-x}BO_\delta$, where $0.001 \le x \le 0.5$, $\delta > 0$, A is at least one of Ca, Sr, and/or Ba, B is Ti or Sn, M is at least one of Sc, Y, Al, In, and/or REE. In some embodiments, the size of crystal grains in active layer a04 is between 2 nm and 300 nm. The thickness of active layer a04 is between 10 nm and 200 nm. The etching rate active layer a04 at 5% concentration of hydrochloric acid is less than 10 nm/min.

In some embodiments, source and drain electrode a05 are conductive thin films. For example, each of source and drain electrode a05 can be a single layer made of metal thin film, such as a single layer of Al, Cu, Mo or Ti. As another example, each of source and drain electrode a05 can be a single layer made of alloy thin film(s), wherein the alloy thin films can comprise any suitable metal elements. In some embodiments, the thickness of the conductive thin films of the source and drain electrode a05 are between 100 nm and 2000 nm.

In some embodiments, passivated layer a06 includes one or more insulating films. For example, passivated layer a06 can be $SiO_2$ film, $Si_3N_4$ film, $Al_2O_3$ film, $Y_2O_3$ film, polyimide film, photoresist film, benzocyclobutene film, or polymethyl methacrylate (PMMA) film. As another example, passivated layer a06 can be multiple layers of insulating films that comprise one or more suitable insulating materials. In some embodiments, the thickness of passivated layer a06 is between 50 nm and 2000 nm.

In some embodiments, the material of active layer a04 comprises a first metal element, a second metal element and a third metal element, wherein the first metal element is at least one of Sc, Y, Al, In, and/or REE, the second metal element is at least one of Ca, Sr, and/or Ba, the third metal element is at least one of Ti, and/or Sn. Because of that, the TFT can have high electron mobility, wide band gap, uniform device performance, high current switching ratio, good light stability, low subthreshold swing, high acid resistance, and/or other characteristics.

Figure 4:
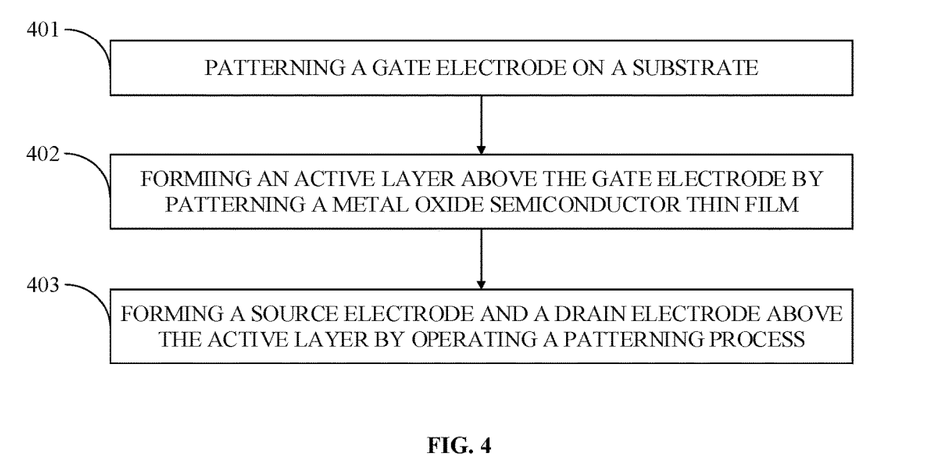
FIG. 4 shows an exemplary method for fabricating a TFT containing a metal oxide semiconductor thin film in accordance with some embodiments of the disclosed subject matter.

Turning to FIG. 4, an exemplary method for fabricating a TFT containing a metal oxide semiconductor thin film is shown in accordance with some embodiments of the disclosed subject matter.

In some embodiments, the method can comprise: fabricating a metal oxide semiconductor thin film as described above in connection with FIGS. 2-1 and 2-2; operating a patterning process for the metal oxide semiconductor thin film patterning treatment to obtain an active layer of a TFT.

In some embodiments, a TFT can be fabricated to include a top gate structure or a bottom gate structure. The exemplary method shown in FIG. 4 is for fabricating the bottom gate structure TFT as an example. Since the method for fabricating the top gate structure TFT is substantially the same, so it is not described here in detail.

As illustrated, the method can begin by patterning a gate electrode on a substrate at Step 401.

Next, at Step 402, an active layer can be formed above the gate electrode by patterning a metal oxide semiconductor thin film.

Next, at Step 403: a source electrode and a drain electrode can be formed above the active layer by a patterning process.

Further, in some embodiments, a passivated layer can be formed above up-surfaces of the active layer, the source electrode, and the drain electrode.

In some embodiments, the fabricated TFT can include a back channel etched structure, as described above in connection with FIG. 3. In this case, the TFT has substrate a01, gate electrode a02, insulating layer a03, active layer a04, source electrode and drain electrode a05, and passivated layer a06.

In some embodiments, gate electrode a02 can be generated by: forming a conductive thin film on the substrate by sputtering, vacuum evaporation, or solution electrolyzing; and using patterning process such as photolithography or shielding mask method to generate the gate electrode.

In some embodiments, insulating layer a03 can be generated by: forming an insulating thin film by anodic oxidation method, thermal oxidation method, physical vapor deposition method, or chemical vapor deposition method; and using patterning process such as photolithography or shielding mask method to generate the insulating layer.

In some embodiments, active layer a04 is a metal oxide semiconductor thin film with the perovskite structure. In some embodiments, active layer a04 can be fabricated by an exemplary four-step process.

The first exemplary step is target preparation. Specifically, the first step comprises: homogeneously mixing the $M_2O_3$ powder, the $ACO_3$ powder, and the $BO_2$ powder at a preset mole percent ratios $(x/2):(1-x):1$; sintering the mixture at a temperature between 900° C. and 1650° C.; milling the sintered product into fine powder; pressing the fine powder into a piece of material plate; sintering the piece of material plate a temperature between 1000° C. and 1800° C.; machining the sintered piece of material plate to generated the target.

The second exemplary step is film deposition. Specifically, using the prepared target, a metal oxide semiconductor thin film can be formed by physical vapor deposition method. In some embodiments, the deposition temperature is between 200° C. and 500° C.

In some embodiments, physical vapor deposition can be sputtering, pulsed laser deposition, or atomic layer deposition.

The third exemplary step is annealing. Specifically, the formed metal oxide semiconductor thin film can be further annealed at a temperature of 300° C. to 500° C.

The fourth exemplary step is patterning. Specifically, the annealed metal oxide semiconductor thin can be patterned by photolithography or shielding mask method.

In some embodiments, source electrode and drain electrode a05 can be formed simultaneously. Specifically, a conductive layer can be formed by vacuum evaporation or sputtering, and the source electrode and the drain electrode can be formed by wet etching the conductive layer.

In some embodiments, passivated layer a06 can be deposited by plasma enhanced chemical vapor deposition (PECVD) method.

In some embodiments, the fabricated TFT comprises a first metal element, a second metal element and a third metal element, wherein the first metal element is at least one of Sc, Y, Al, In, and/or REE, the second metal element is at least one of Ca, Sr, and/or Ba, the third metal element is at least one of Ti, and/or Sn. Because of that, the TFT can have high electron mobility, wide band gap, uniform device performance, high current switching ratio, good light stability, low subthreshold swing, high acid resistance, and/or other characteristics.

In some embodiments, an array substrate that comprises any one of the TFT described above can be provided.

In some embodiments, a display apparatus that comprises the array substrate described above can be provided.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a metal oxide semiconductor thin film, a related thin film transistor, fabricating method of the metal oxide semiconductor thin film and the thin film transistor, and a related display apparatus are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A metal oxide semiconductor, comprising a metal oxide including a first metal element, a second metal element and a third metal element, wherein:
   the first metal element is at least one of scandium, yttrium, aluminum, indium, or a rare earth element;
   the second metal element is at least one of calcium, strontium, or barium; and
   the third metal element is at least one of titanium or tin.

2. The metal oxide semiconductor of claim 1, wherein:
   the metal oxide has a chemical formula $M_xA_{1-x}BO_\delta$, $0.001 \le x \le 0.5$;
   $\delta > 0$;
   M is the first metal element;
   A is the second metal element; and
   B is the third metal element.

3. The metal oxide semiconductor of claim 2, wherein the metal oxide has a chemical formula $In_xBa_{1-x}TiO_\delta$.

4. The metal oxide semiconductor of claim 2, wherein the metal oxide has a chemical formula $La_xSr_{1-x}SnO_\delta$.

5. The metal oxide semiconductor of claim 1, wherein the metal oxide semiconductor has a plurality of crystalline phases.

6. The metal oxide semiconductor of claim 5, wherein the plurality of crystalline phases comprise a perovskite crystalline phase.

7. The metal oxide semiconductor of claim 6, wherein the plurality of crystalline phases further comprise at least one of: a crystalline phase of an oxide of the first metal element, a crystalline phase of an oxide of the second metal element, or a crystalline phase of an oxide of the third metal element.

8. The metal oxide semiconductor of claim 6, wherein the plurality of crystalline phases further comprise at least one of: a crystalline phase of a ternary metal oxide, or a crystalline phase of a quaternary metal oxide.

9. The metal oxide semiconductor of claim 6, wherein:
   a unit cell of the perovskite crystalline phase includes a cubic lattice system;
   the first metal element is located on a first vertex of the unit cell;
   the second metal element is located on a body-centered position of the unit cell;
   an oxide element is located on a face-centered position; and
   the third metal element is located on a second vertex of the unit cell.

10. The metal oxide semiconductor of claim 1, wherein:
the metal oxide semiconductor has an etching rate less than 10 nm/min at a preset mass concentration of hydrochloric acid; and
the preset mass concentration is greater than or equal to 3%, and less than or equal to 10%.

11. The metal oxide semiconductor of claim 1, wherein the metal oxide semiconductor has a crystal grain size between 2 nm and 300 nm.

12. The metal oxide semiconductor of claim 1, wherein the metal oxide semiconductor is a thin film that has a thickness between 10 nm and 300 nm.

13. A method for fabricating a metal oxide semiconductor thin film, the method comprising:
preparing a metal oxide target, wherein:
the metal oxide comprises a first metal element, a second metal element and a third metal element;
the first metal element is at least one of scandium, yttrium, aluminum, indium, or a rare earth element;
the second metal element is at least one of calcium, strontium, or barium;
the third metal element is at least one of titanium or tin; and
forming the metal oxide semiconductor thin film by processing the metal oxide target.

14. The method for fabricating the metal oxide semiconductor thin film of claim 13, further comprising:
obtaining a mixture of a first oxide powder comprising the first metal element, a carbonate powder comprising the second metal element, and a second oxide powder comprising the third metal element; and
sintering the mixture at a first predetermined temperature to obtain the metal oxide.

15. The method for fabricating the metal oxide semiconductor thin film of claim 14, further comprising:
milling the metal oxide into a third oxide powder;
pressing the third oxide powder into a piece of material plate; and
machining the piece of material plate to obtain the target material of the metal oxide.

16. The method for fabricating the metal oxide semiconductor thin film of claim 14, wherein a ratio of the first oxide powder, the carbonate powder, and the second oxide powder is $(x/2):(1-x):1$, wherein $0.001 \leq x \leq 0.5$.

17. The method for fabricating the metal oxide semiconductor thin film of claim 13, further comprising:
annealing the metal oxide semiconductor thin film at a second preset temperature; and
the second preset temperature is between 200° C. and 300° C.

18. A thin-film-transistor, comprising an active layer made of the metal oxide semiconductor according to claim 1.

19. An array substrate, comprising the thin-film-transistor according to claim 18.

20. A display apparatus, comprising the array substrate according to claim 19.

* * * * *